(12) United States Patent
Ratnakar Aravind et al.

(10) Patent No.: US 8,904,070 B2
(45) Date of Patent: Dec. 2, 2014

(54) SYSTEMS AND METHODS FOR DIGITAL MRA COMPENSATION

(75) Inventors: Nayak Ratnakar Aravind, Allentown, PA (US); Yu Liao, Longmont, CO (US); Haitao Xia, San Jose, CA (US)

(73) Assignee: LSI Corporation, San Jose, CA (US)

( * ) Notice: Subject to any disclaimer, the term of this patent is extended or adjusted under 35 U.S.C. 154(b) by 206 days.

(21) Appl. No.: 13/362,466

(22) Filed: Jan. 31, 2012

(65) Prior Publication Data

US 2013/0198421 A1     Aug. 1, 2013

(51) Int. Cl.
G06F 13/12      (2006.01)
G06F 13/38      (2006.01)
H03M 1/12       (2006.01)

(52) U.S. Cl.
CPC ..................... H03M 1/12 (2013.01)
USPC .......................................................... 710/69

(58) Field of Classification Search
CPC ..................... G06F 3/00; G06F 9/00
USPC .......................................................... 710/69
See application file for complete search history.

(56) References Cited

U.S. PATENT DOCUMENTS

| | | | |
|---|---|---|---|
| 6,301,068 B1 | 10/2001 | Ionescu | |
| 6,519,106 B1* | 2/2003 | Goh et al. | 360/65 |
| 7,423,827 B2 | 9/2008 | Neville | |
| 7,680,217 B2 | 3/2010 | Wilson | |
| 7,929,240 B2 | 4/2011 | Mathew | |
| 2005/0094301 A1* | 5/2005 | Berman et al. | 360/48 |
| 2005/0219729 A1* | 10/2005 | Franck | 360/46 |
| 2006/0082915 A1* | 4/2006 | Eleftheriou et al. | 360/55 |
| 2007/0019316 A1* | 1/2007 | Norton, Jr. | 360/29 |
| 2007/0076313 A1* | 4/2007 | Hutchins et al. | 360/46 |
| 2011/0242691 A1 | 10/2011 | Burger | |

OTHER PUBLICATIONS

U.S. Appl. No. 13/302,169, Unpublished, filed Nov. 22, 2011, Boris Livshitz.
U.S. Appl. No. 13/113,210, Unpublished, filed May 23, 2011, Xun Zhang.
U.S. Appl. No. 13/100,063, Unpublished, filed May 3, 2011, Ming Jin.
U.S. Appl. No. 13/096,900, Unpublished, filed Apr. 28, 2011, Ross S. Wilson.

* cited by examiner

*Primary Examiner* — Idriss N Alrobaye
*Assistant Examiner* — Brooke Taylor
(74) *Attorney, Agent, or Firm* — Hamilton DeSanctis & Cha

(57) ABSTRACT

Various embodiments of the present invention provide systems and methods for data processing. For example, a data processing system is discussed that includes: an analog to digital converter circuit, and a magneto-resistive adjustment circuit. The analog to digital converter circuit is operable to convert an input signal into corresponding digital samples. The magneto-resistive adjustment circuit is operable to reduce signal asymmetry in the digital samples due to sensing by a magneto-resistive head to yield a corrected output.

15 Claims, 4 Drawing Sheets

US 8,904,070 B2

SYSTEMS AND METHODS FOR DIGITAL MRA COMPENSATION

BACKGROUND OF THE INVENTION

The present inventions are related to systems and methods for compensating signals received from a magneto-resistive head, and more particularly to systems and methods for determining the applicable compensation for distortion introduced by a magneto-resistive head.

Some devices rely on magneto-resistive heads to sense information which is then processed to recover an originally written data set. Such heads typically exhibit some level of non-linear distortion that causes significant degradation in the performance of a data detection circuit, and in some cases disqualification of magneto-resistive heads where the degradation becomes too large. To avoid this degradation, magneto-resistive head compensation is applied to an analog signal derived from a magneto-resistive head to yield a corrected signal. The corrected signal is then filtered and the resulting filtered output is converted to a series of digital samples representing the filtered output. Digital data processing is then applied to the series of digital samples to yield the original data set. Existing approaches are, however, costly in terms of the circuitry required to perform the correction and/or of limited effectiveness.

Hence, for at least the aforementioned reasons, there exists a need in the art for advanced systems and methods for data processing.

BRIEF SUMMARY OF THE INVENTION

The present inventions are related to systems and methods for compensating signals received from a magneto-resistive head, and more particularly to systems and methods for determining the applicable compensation for distortion introduced by a magneto-resistive head.

Various embodiments of the present invention provide data processing systems that include: an analog to digital converter circuit, and a magneto-resistive adjustment circuit. The analog to digital converter circuit is operable to convert an input signal into corresponding digital samples. The magneto-resistive adjustment circuit is operable to reduce signal asymmetry in the digital samples due to sensing by a magneto-resistive head to yield a corrected output. In some instances of the aforementioned embodiments, the system further includes an equalizer circuit operable to equalize the corrected output to yield an equalized output. In some cases, the equalizer circuit is a finite impulse response circuit.

In some instances of the aforementioned embodiments, the magneto-resistive adjustment circuit includes a filter circuit and a digital magneto-resistive compensation circuit. The filter circuit is operable to filter the digital samples to yield a filtered output. The digital magneto-resistive compensation circuit is operable to reduce signal asymmetry in the filtered output to yield the corrected output.

In various instances of the aforementioned embodiments, the system further includes a filter circuit operable to filter an analog input to yield the input signal. In some cases, the filter circuit has six poles and two zeros. In various cases, the magneto-resistive adjustment circuit includes an inverse filter circuit, and a digital magneto-resistive compensation circuit. The inverse filter circuit is operable to approximately reverse the filtering applied by the filter circuit to yield an inverse filtered output. The digital magneto-resistive compensation circuit is operable to reduce signal asymmetry in the inverse filtered output to yield a compensated output. The corrected output is derived from the compensated output. In some cases, the digital magneto-resistive compensation circuit is a single sided, second order filter. In other cases, the digital magneto-resistive compensation circuit is a double sided, second order filter. It should be noted that some embodiments of the present invention may use a higher order filter that the previously mentioned second order filter. In various cases, the filter circuit is a first filter circuit, and the magneto-resistive adjustment circuit further includes a second filter circuit operable to filter the compensated output to yield the corrected output. In some particular cases, the inverse filter circuit is a digital finite impulse response filter circuit based upon least-squares criterion such that a convolution of the second filter circuit and the inverse filter circuit reduces inter-symbol interference.

Other embodiments of the present invention provide methods for data processing that include: converting an input signal into a corresponding series of digital samples using an analog to digital converter circuit, wherein the input signal is derived from a magneto-resistive head; and applying a magneto-resistive adjustment to the series of digital samples to yield a corrected output. The corrected output exhibits reduced signal asymmetry compared with the series of digital samples. In some instances of the aforementioned embodiments, the method further includes equalizing the corrected output to yield an equalized output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for compensating signals received from a magneto-resistive head, and more particularly to systems and methods for determining the applicable compensation for distortion introduced by a magneto-resistive head.

Various embodiments of the present invention provide data processing circuits that include a data input circuit having a mangeto-resistive asymmetry (MRA) compensation circuit in the digital domain. In some cases, an inverse filter circuit is also included in the digital domain that reverses a continuous time filter implemented in the analog domain of the data input circuit. In yet other cases, a filter circuit is also included in the digital domain that approximately replaces the functionality of a continuous time filter in the analog domain.

Figure 1:
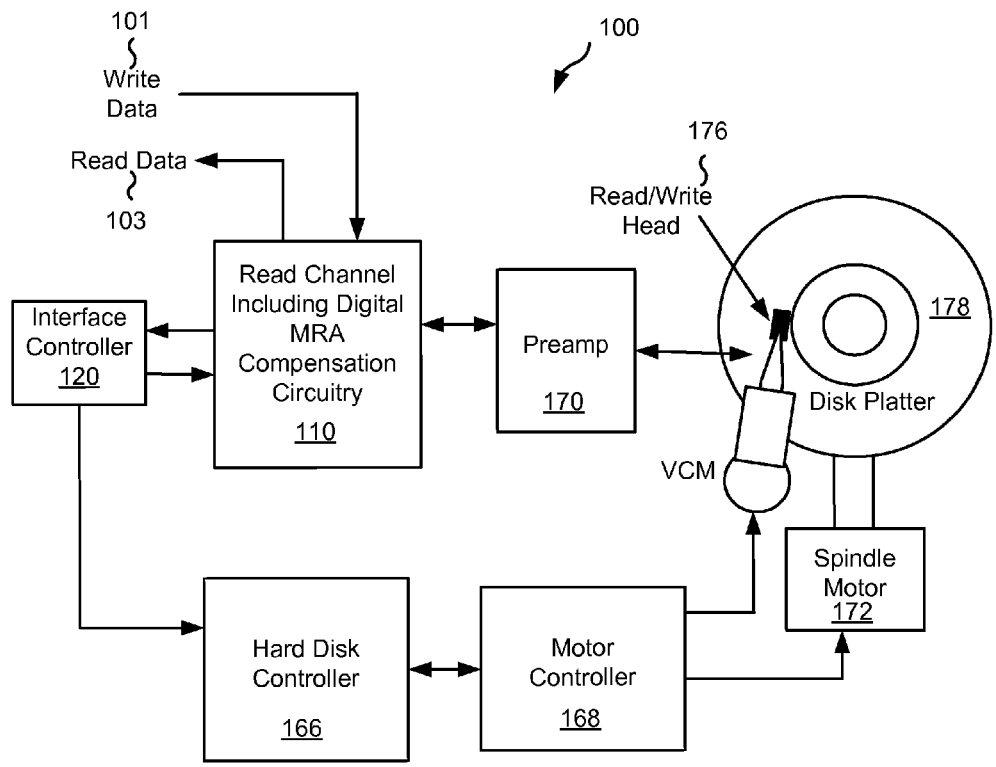
FIG. 1 shows a storage system including a read channel circuit having digital MRA compensation circuitry in accordance with some embodiments of the present invention.

Turning to FIG. 1, a storage system 100 including a read channel circuit 110 having digital MRA compensation circuitry is shown in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176 that incorporates a magneto-resistive head. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

During operation, data accessed from disk platter 178 is processed using a data input circuit that includes digital MRA compensation circuitry. In some cases, the data input circuit may include circuitry similar to that discussed below in relation to FIG. 3 or FIG. 5. In various cases, the data input circuit may operate consistent with the approaches discussed below in relation to FIG. 4 or FIG. 6.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 2:
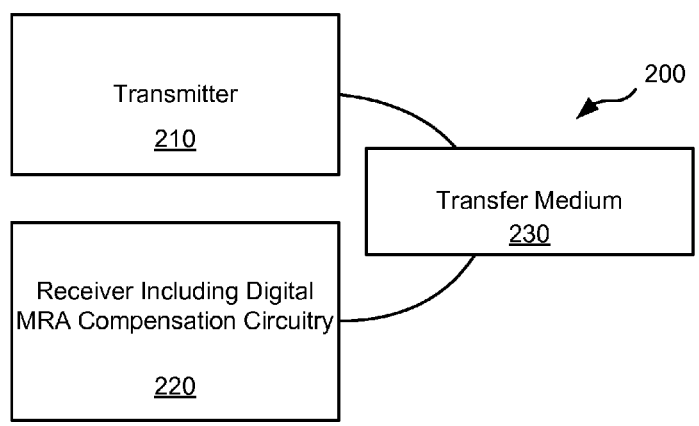
FIG. 2 depicts a communication system including a receiver having digital MRA compensation circuitry in accordance with various embodiments of the present invention.

Turning to FIG. 2, a communication system 200 including a receiver 220 having digital MRA compensation circuitry is shown in accordance with some embodiments of the present invention. Communication system 200 includes a transmitter 210 that is operable to transmit encoded information via a transfer medium 230 as is known in the art. The encoded data is received from transfer medium 230 by receiver 220. Transfer medium 230 may be any transfer medium known in the art including, but not limited to, a wireless medium, a wired medium, storage medium, an optical medium, or the like. Based upon the disclosure provided herein, one of ordinary skill in the art will recognize a variety of transfer mediums that may be used in relation to different embodiments of the present invention.

During operation, information is transferred by transmitter 210 to receiver 220 via transfer medium 230. The received data is processed using a data input circuit that includes digital MRA compensation circuitry. In some cases, the data input circuit may include circuitry similar to that discussed below in relation to FIG. 3 or FIG. 5. In various cases, the data input circuit may operate consistent with the approaches discussed below in relation to FIG. 4 or FIG. 6.

Figure 3:
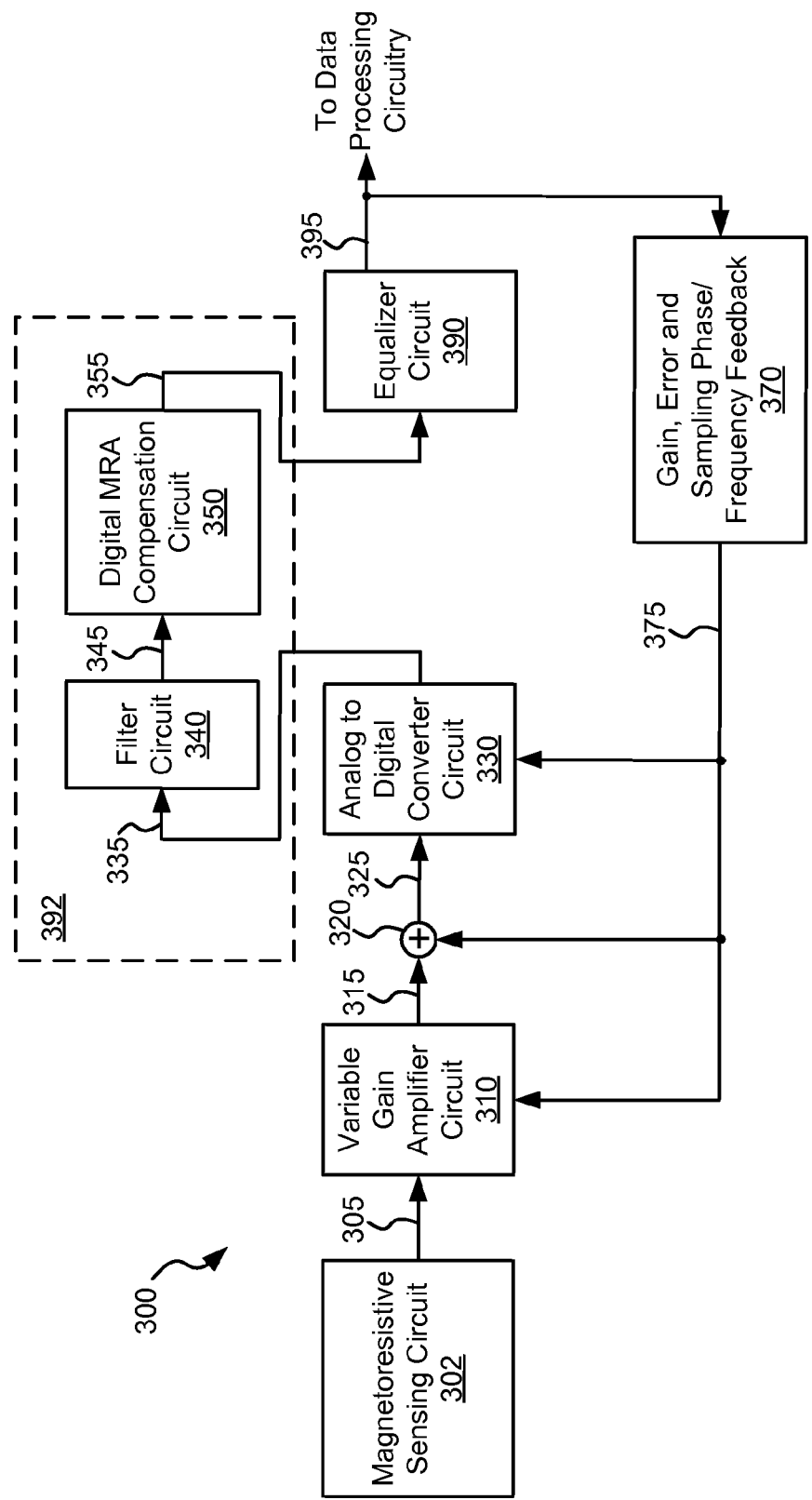
FIG. 3 depicts a data input circuit including digital MRA compensation and filtering circuitry in accordance with some embodiments of the present invention.

Turning to FIG. 3, a data input circuit 300 including digital MRA compensation and filtering circuitry in accordance with some embodiments of the present invention. Data input circuit 300 includes a magneto-resistive sensing circuit 302. Magneto resistive sensing circuit 302 is operable to sense magnetic information and to provide the sensed information as an analog input 305. Magneto resistive sensing circuit 302 may be any circuit known in the art that is capable of sensing magnetic information. Magneto-resistive sensing circuit 302 generally exhibits a non-linear or asymmetric input to output transfer function. This asymmetry often results in degradation of downstream processing. In some embodiments of the present invention, magneto-resistive sensing circuit 302 senses information from a storage medium. Based upon the disclosure provided herein, one of ordinary skill in the art will recognize other sources from which magneto-resistive sensing circuit 302 may sense information.

Analog input 305 is provided to a variable gain amplifier circuit 310 that applies a variable gain to analog input 305 to yield an amplified output 315. The applied gain corresponds to a gain feedback value (i.e., a subset of an output 375). Variable gain amplifier circuit 310 may be any circuit known in the art that is capable of modifying a received input by a gain corresponding to a gain input. Based upon the disclosure provided herein, one of ordinary skill in the art will recognize a variety of variable gain amplifier circuits that may be used in relation to different embodiments of the present invention.

Amplified output 315 is provided to a summation circuit 320 where an error feedback value (i.e., a subset of output 375) is subtracted therefrom to yield a summed output 325. Summed output 325 is provided to an analog to digital converter circuit 330. Analog to digital converter circuit 330 converts summed output 325 to a corresponding series of digital samples 335. Analog to digital converter circuit 330 may be any circuit known in the art that is capable of converting a continuous time signal in to a series of discrete samples. Based upon the disclosure provided herein, one of ordinary skill in the art will recognize a variety of analog to digital converter circuits that may be used in relation to different embodiments of the present invention.

Digital samples 335 are provided to a magneto-resistive adjustment circuit 392. Magneto-resistive compensation circuit 392 includes a filter circuit 340, and a digital magneto-resistive asymmetry (MRA) compensation circuit 350. Digital samples 335 are provided to filter circuit 340. Filter circuit 340 is designed to filter noise from digital samples 335 to yield a filtered output 345. In some embodiments of the present invention, filter circuit 340 is a digitally implemented band pass filter. Based upon the disclosure provided herein, one of ordinary skill in the art will recognize a variety of filters that may be used in relation to different embodiments of the present invention. Filtered output 345 is provided to digital magneto-resistive asymmetry (MRA) compensation circuit 350. Magneto-resistive asymmetry (MRA) compensation circuit 350 provides a corrected output 355. Magneto-resistive asymmetry (MRA) compensation circuit 350 is operable to reduce non-linearities in filtered output 345 introduced by magneto-resistive sensing circuit 302. In some embodiments of the present invention, magneto-resistive asymmetry compensation circuit 350 is a single sided, second order filter. Such a single sided, second order filter applies the same second order filtering to both positive values of filtered output 345 and negative values of filtered output 345.

In other embodiments of the present invention, magneto-resistive asymmetry compensation circuit 350 is a double sided, second order filter. Such a double sided, second order filter applies one second order filter function to a first set of the values received as filtered output 345 and another second order filter function to a second set of the values received as filtered output 345. In some cases, the first set of the values received as filtered output 345 includes all positive values, and the second set of the values received as filtered output 345 includes all negative values. In particular cases, the double sided, second order filter includes squaring that "expands" the instances of positive signals and "compresses" or reduces the negative signals. In such cases, scaling factors are chosen for the terms of magneto-resistive asymmetry compensation circuit 350 to oppose the aforementioned expansion and compression. In one particular embodiment of the present invention, positive values received as filtered output 345 are multiplied by a scaling factor of 0.375 and the negative values are multiplied by 1/0.375 before application of the second order filter.

Corrected output 355 is provided to an equalizer circuit 390. Equalizer circuit 390 equalizes the received input to yield an equalized output 395 that is provided to downstream data processing circuitry (not shown). Such downstream data processing circuitry may include, but is not limited to, a data detector circuit and a data decoder circuit. The data detector circuit may be, but is not limited to a maximum a posteriori data detector circuit or a Viterbi algorithm data detector circuit as are known in the art. The data decoder circuit may be, but is not limited to, a low density parity check decoder circuit as are known in the art. Equalizer circuit 390 may be any circuit known in the art that is capable of equalizing a data input. In some cases, equalizer circuit 390 is implemented as a digital finite impulse response (DFIR) filter as are known in the art. Equalized output may be provided to a gain, error, sampling phase/frequency feedback circuit 370 providing output 375 based on equalized output 395. Based upon the disclosure provided herein, one of ordinary skill in the art will recognize a variety of circuits that may be used to provide feedback based upon equalized output 395 as output 375.

Figures 4, 6:
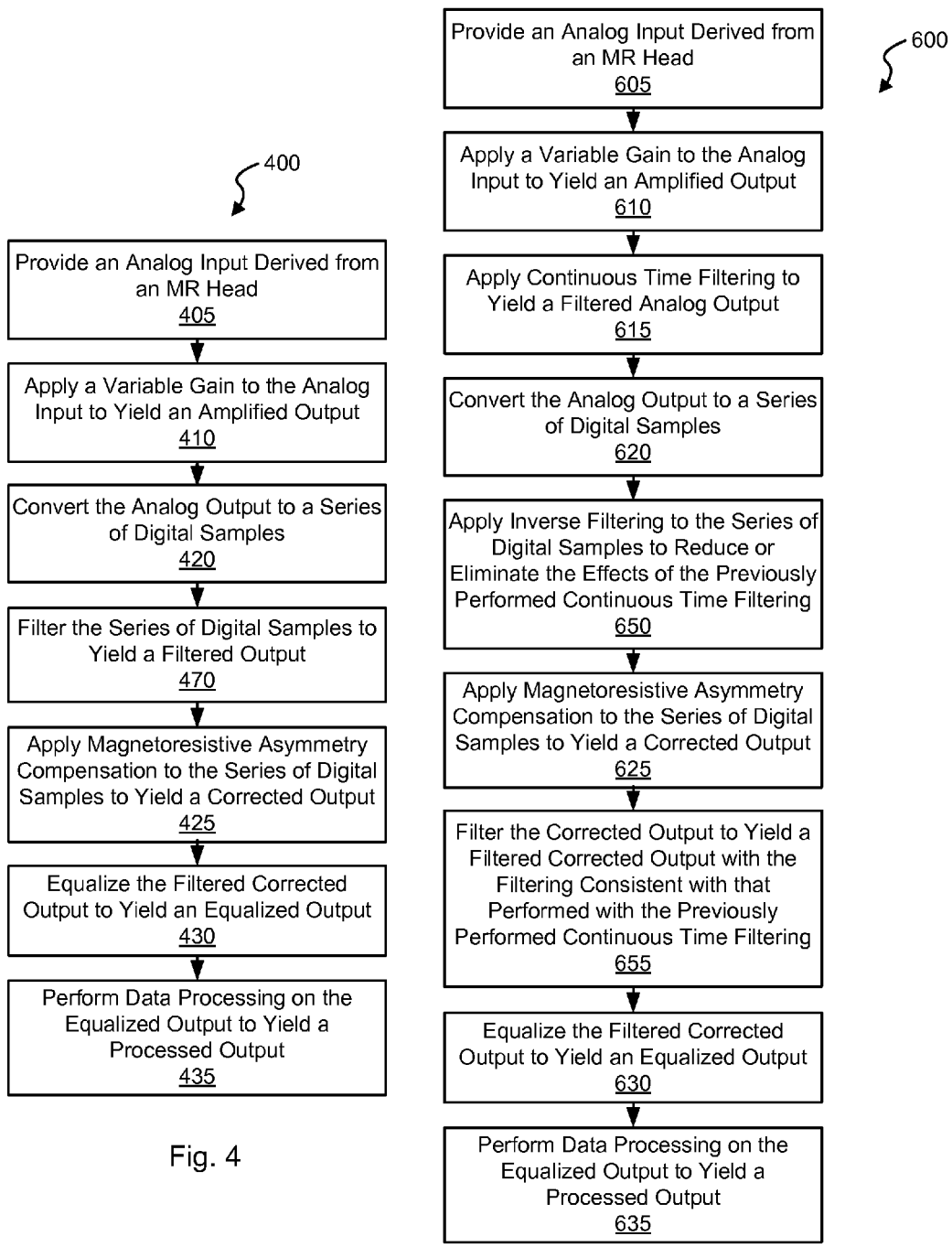
FIG. 4 is a flow diagram showing a method in accordance with various embodiments of the present invention for digital domain MRA compensation.
FIG. 6 is a flow diagram showing a method in accordance with other embodiments of the present invention for digital domain MRA compensation.

Turning to FIG. 4, a flow diagram 400 shows a method in accordance with various embodiments of the present invention for digital domain MRA compensation. Following flow diagram 400, an analog input derived from a magnetoreistive head is received (block 405). The provided analog input generally exhibits a non-linear or asymmetric input to output transfer function. This asymmetry often results in degradation of downstream processing. In some embodiments of the present invention, the provided input may be sensed by the magneto-resistive head from a storage medium. Based upon the disclosure provided herein, one of ordinary skill in the art will recognize other sources from which the magneto-resistive head may sense information.

The analog input is amplified by a variable gain amplifier to yield an amplified output (block 410). The amplified output is then converted to a series of corresponding digital samples (block 420). The analog to digital conversion may be done using any analog to digital conversion process known in the art. The series of digital samples are then filtered to yield a filtered output (block 470). The filtering may be a digital band-pass filtering designed to reduce noise components in the received signal.

Magneto-resistive asymmetry compensation is applied to the filtered output to reduce non-linearities in the filtered signal due to the magneto-resistive head to yield a corrected output (block 425). In some embodiments of the present invention, the magneto-resistive asymmetry compensation is done using a single sided, second order filter circuit. Such a single sided, second order filter circuit applies the same second order filtering to both positive values of the received filtered output, and negative values of the received filtered output.

In other embodiments of the present invention, magneto-resistive asymmetry compensation is done using a double sided, second order filter circuit. Such a double sided, second order filter circuit applies one second order filter function to a first set of the values received as the filtered output and another second order filter function to a second set of the values received as the filtered output. In some cases, the first set of the values received as the filtered output includes all positive values, and the second set of the values received as the filtered output includes all negative values. In particular cases, the double sided, second order filter includes squaring that "expands" the instances of positive signals and "compresses" or reduces the negative signals. In such cases, scaling factors are chosen for the terms of magneto-resistive asymmetry compensation to oppose the aforementioned expansion and compression. In one particular embodiment of the present invention, positive values received as the filtered output are multiplied by a scaling factor of 0.375 and the negative values are multiplied by 1/0.375 before application of the second order filter.

The corrected output is equalized to yield an equalized output (block 430). In some embodiments of the present invention, the equalization is done using a finite impulse response filter circuit. Data processing is then applied to the equalized output to yield a processed output (block 435). In some embodiments of the present invention, the data processing includes a combination of applying a data detection algorithm and a data decode algorithm to the equalized data. The data detection algorithm may be, but is not limited to a maximum a posteriori data detection algorithm or a Viterbi data detection algorithm as are known in the art. The data decode algorithm may be, but is not limited to, a low density parity check decode algorithm as are known in the art. Based upon the disclosure provided herein, one of ordinary skill in the art will recognize a variety of data processing that may be applied to the equalized output.

Figure 5:
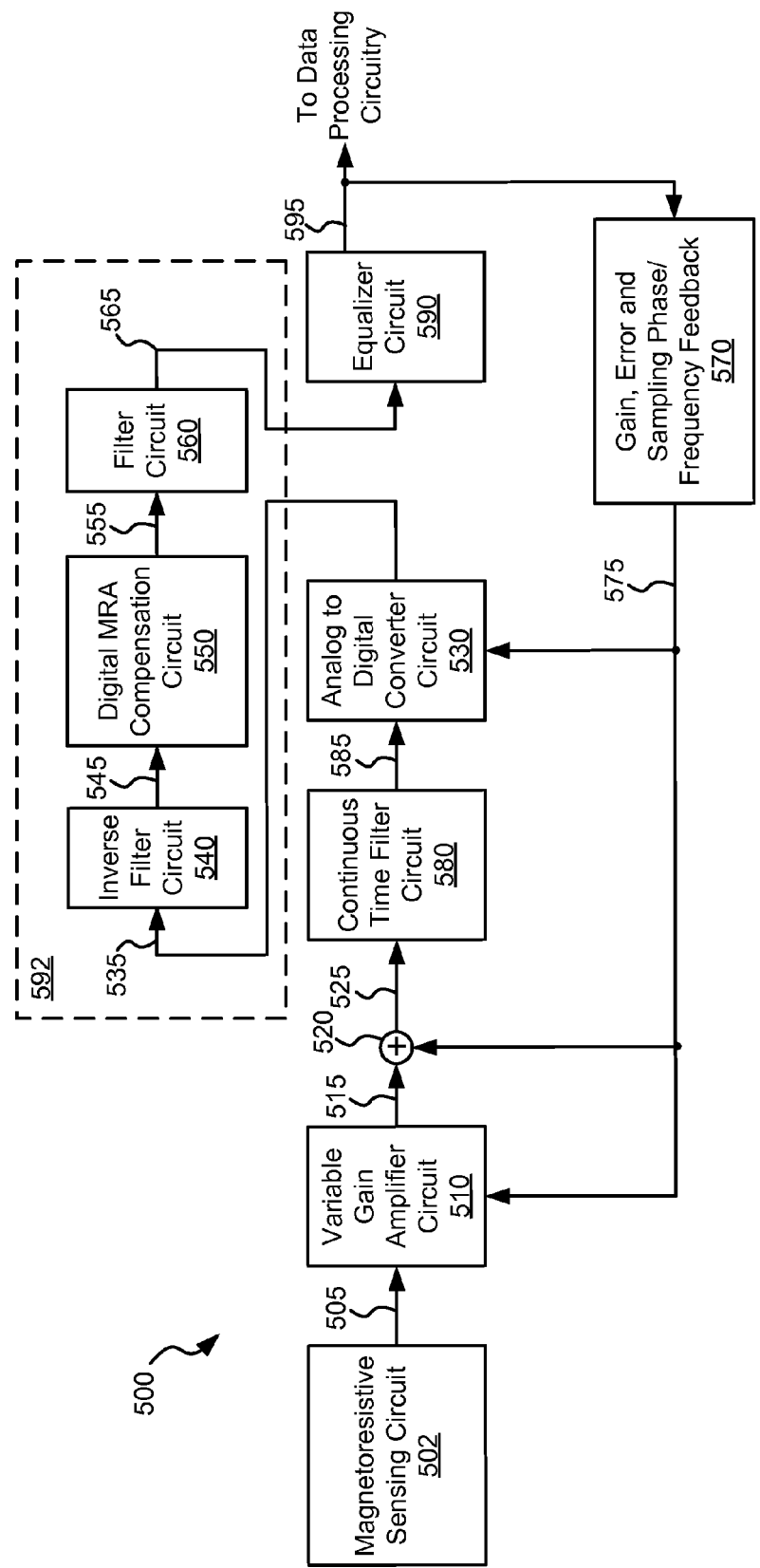
FIG. 5 depicts a data input circuit including digital MRA compensation and inverse filtering circuitry in accordance with some embodiments of the present invention.

Turning to FIG. 5, a data input circuit 500 including digital MRA compensation and inverse filtering circuitry in accordance with some embodiments of the present invention in accordance with some embodiments of the present invention. Data input circuit 500 includes a magneto-resistive sensing circuit 502. Magneto resistive sensing circuit 502 is operable to sense magnetic information and to provide the sensed information as an analog input 505. Magneto resistive sensing circuit 502 may be any circuit known in the art that is capable of sensing magnetic information. Magneto-resistive sensing circuit 502 generally exhibits a non-linear or asymmetric input to output transfer function. This asymmetry often results in degradation of downstream processing. In some embodiments of the present invention, magneto-resistive sensing circuit 502 senses information from a storage medium. Based upon the disclosure provided herein, one of ordinary skill in the art will recognize other sources from which magneto-resistive sensing circuit 502 may sense information.

Analog input 505 is provided to a variable gain amplifier circuit 510 that applies a variable gain to analog input 505 to yield an amplified output 515. The applied gain corresponds to a gain feedback value (i.e., a subset of an output 575). Variable gain amplifier circuit 510 may be any circuit known in the art that is capable of modifying a received input by a gain corresponding to a gain input. Based upon the disclosure provided herein, one of ordinary skill in the art will recognize a variety of variable gain amplifier circuits that may be used in relation to different embodiments of the present invention.

Amplified output 515 is provided to a summation circuit 520 where an error feedback value (i.e., a subset of output 575) is subtracted there from to yield a summed output 525. Summed output 525 is provided to a continuous time filter 580. Continuous time filter 580 applies an analog filter to summed output 525 to yield a filtered output 585. Continuous time filter 580 may be any analog filter known in the art. In one particular embodiment of the present invention, continuous time filter 580 has six poles and two zeros and exhibits a 32% cutoff and a 19 dB boost. Filtered output 585 is provided to an analog to digital converter circuit 530. Analog to digital converter circuit 530 converts filtered output 585 to a corresponding series of digital samples 535. Analog to digital converter circuit 530 may be any circuit known in the art that is capable of converting a continuous time signal in to a series of discrete samples. Based upon the disclosure provided herein, one of ordinary skill in the art will recognize a variety of analog to digital converter circuits that may be used in relation to different embodiments of the present invention.

Digital samples 535 are provided to a magneto-resistive adjustment circuit 592. Magneto-resistive compensation circuit 592 includes an inverse filter circuit 540, a digital magneto-resistive asymmetry (MRA) compensation circuit 550, and a filter circuit 560. Digital samples 535 are provided to inverse filter circuit 540. Inverse filter circuit 540 is designed to reverse the filtering earlier applied by continuous time filter 580 and provide an inverse filtered output 545. In one particular embodiment of the present invention, inverse filter circuit 540 is a fifteen tap finite impulse response filter circuit based upon least-squares criterion such that the convolution of filter circuit 560 and inverse filter circuit 540 yields a filtered output 565 that is substantially free of inter-symbol interference. For the purposes of this document, a filtered output is considered substantially free of inter-symbol interference where the remaining inter-symbol interference is less than half of the inter-symbol interference in a corresponding unfiltered signal.

Inverse filtered output 545 is provided to digital magneto-resistive asymmetry (MRA) compensation circuit 550. Magneto-resistive asymmetry (MRA) compensation circuit 550 provides a corrected output 555. Magneto-resistive asymmetry (MRA) compensation circuit 550 is operable to reduce non-linearities in inverse filtered output 545 introduced by magneto-resistive sensing circuit 502. In some embodiments of the present invention, magneto-resistive asymmetry compensation circuit 550 is a single sided, second order filter. Such a single sided, second order filter applies the same second order filtering to both positive values of inverse filtered output 545 and negative values of inverse filtered output 545.

In other embodiments of the present invention, magneto-resistive asymmetry compensation circuit 550 is a double sided, second order filter. Such a double sided, second order filter applies one second order filter function to a first set of the values received as inverse filtered output 545 and another second order filter function to a second set of the values received as inverse filtered output 545. In some cases, the first set of the values received as inverse filtered output 545 includes all positive values, and the second set of the values received as inverse filtered output 545 includes all negative values. In particular cases, the double sided, second order filter includes squaring that "expands" the instances of positive signals and "compresses" or reduces the negative signals. In such cases, scaling factors are chosen for the terms of magneto-resistive asymmetry compensation circuit 550 to oppose the aforementioned expansion and compression. In one particular embodiment of the present invention, positive values received as inverse filtered output 545 are multiplied by a scaling factor of 0.375 and the negative values are multiplied by 1/0.375 before application of the second order filter.

Corrected output 555 is provided to filter circuit 560 where it is filtered to yield filtered output 565. Filter circuit 560 is designed to re-create the approximate filtering earlier applied by continuous time filter circuit 580. In one particular embodiment of the present invention, filter circuit 560 is a six tap finite impulse response filter designed to approximate the impulse response of continuous time filter 560. Filtered output 565 is provided to an equalizer circuit 590. Equalizer circuit 590 equalizes the received input to yield an equalized output 595 that is provided to downstream data processing circuitry (not shown). Such downstream data processing circuitry may include, but is not limited to, a data detector circuit and a data decoder circuit. The data detector circuit may be, but is not limited to a maximum a posteriori data detector circuit or a Viterbi algorithm data detector circuit as are known in the art. The data decoder circuit may be, but is not limited to, a low density parity check decoder circuit as are known in the art. Equalizer circuit 590 may be any circuit known in the art that is capable of equalizing a data input. In some cases, equalizer circuit 590 is implemented as a digital finite impulse response (DFIR) filter as are known in the art. Equalized output may be provided to a gain, error, sampling phase/frequency feedback circuit 570 providing output 575 based on equalized output 595. Based upon the disclosure provided herein, one of ordinary skill in the art will recognize a variety of circuits that may be used to provide feedback based upon equalized output 595 as output 575.

Turning to FIG. 6, a flow diagram 600 shows a method in accordance with other embodiments of the present invention for digital domain MRA compensation. Following flow diagram 600, an analog input derived from a magnetoreistive head is received (block 605). The provided analog input generally exhibits a non-linear or asymmetric input to output transfer function. This asymmetry often results in degradation of downstream processing. In some embodiments of the present invention, the provided input may be sensed by the magneto-resistive head from a storage medium. Based upon the disclosure provided herein, one of ordinary skill in the art will recognize other sources from which the magneto-resistive head may sense information.

The analog input is amplified by a variable gain amplifier to yield an amplified output (block 610). Continuous time filtering is then applied to the amplified output to yield a filtered analog output (block 615). The continuous time filtering may be any analog filtering known in the art. In one particular embodiment of the present invention, a continuous time filter circuit having six poles and two zeros and exhibiting a 32% cutoff and a 19 dB boost is used. The filtered analog output is then converted to a series of corresponding digital samples (block 620). The analog to digital conversion may be done using any analog to digital conversion process known in the art. The series of digital samples are then filtered to yield a filtered output (block 470). The filtering may be a digital band-pass filtering designed to reduce noise components in the received signal.

Inverse filtering is applied to the series of digital samples to digitally approximate the amplified output (i.e., the signal prior to the continuous time filtering in block 615) (block 650). The result is an inverse filtered output. In one particular embodiment of the present invention, the inverse filtering is done using a fifteen tap finite impulse response filter circuit based upon least-squares criterion such that the convolution of a subsequent filtering (block 655) and the inverse filtering process yields a filtered output that is substantially free of inter-symbol interference.

Magneto-resistive asymmetry compensation is applied to the inverse filtered output to reduce non-linearities in the filtered signal due to the magneto-resistive head to yield a corrected output (block 625). In some embodiments of the present invention, the magneto-resistive asymmetry compensation is done using a single sided, second order filter circuit. Such a single sided, second order filter circuit applies the same second order filtering to both positive values of the received filtered output, and negative values of the received filtered output.

In other embodiments of the present invention, magneto-resistive asymmetry compensation is done using a double sided, second order filter circuit. Such a double sided, second order filter circuit applies one second order filter function to a first set of the values received as the filtered output and another second order filter function to a second set of the values received as the filtered output. In some cases, the first set of the values received as the filtered output includes all positive values, and the second set of the values received as the filtered output includes all negative values. In particular cases, the double sided, second order filter includes squaring that "expands" the instances of positive signals and "compresses" or reduces the negative signals. In such cases, scaling factors are chosen for the terms of magneto-resistive asymmetry compensation to oppose the aforementioned expansion and compression. In one particular embodiment of the present invention, positive values received as the filtered output are multiplied by a scaling factor of 0.375 and the negative values are multiplied by 1/0.375 before application of the second order filter.

The corrected output is filtered to yield a filtered corrected output (block 655). The filtering of block 655 is designed to re-create the approximate filtering earlier applied by the continuous time filtering of block 615. In one particular embodiment of the present invention, the filtering is performed by a six tap finite impulse response filter designed to approximate the impulse response of the earlier applied continuous time filter. The filtered corrected output is equalized to yield an equalized output (block 630). In some embodiments of the present invention, the equalization is done using a finite impulse response filter circuit. Data processing is then applied to the equalized output to yield a processed output (block 635). In some embodiments of the present invention, the data processing includes a combination of applying a data detection algorithm and a data decode algorithm to the equalized data. The data detection algorithm may be, but is not limited to a maximum a posteriori data detection algorithm or a Viterbi data detection algorithm as are known in the art. The data decode algorithm may be, but is not limited to, a low density parity check decode algorithm as are known in the art. Based upon the disclosure provided herein, one of ordinary skill in the art will recognize a variety of data processing that may be applied to the equalized output.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for limiting the effects of non-linear distortion. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a first circuit operable to apply filter and analog signal to yield an input signal;
   an analog to digital converter circuit operable to convert the input signal into corresponding digital samples;
   a magneto-resistive adjustment circuit operable to reduce signal asymmetry in the digital samples due to sensing by a magneto-resistive head to yield a corrected output, wherein the magneto-resistive adjustment circuit includes:
   a second filter circuit operable to filter the digital samples to yield a filtered output, wherein the filtering applied by the second filter circuit approximately reverses the filtering applied by the first filter circuit; and a digital magneto-resistive compensation circuit operable to apply the same second order filtering to both positive values and negative values of the filtered output to reduce signal asymmetry in the filtered output to yield the corrected output;

and an equalizer circuit operable to equalize the corrected output to yield an equalized output.

2. The system of claim 1, wherein the equalizer circuit is a finite impulse response circuit.

3. A method for data processing, the method comprising:

filtering an analog input to yield the input signal using a first filter circuit;

converting the input signal into a corresponding series of digital samples using an analog to digital converter circuit, wherein the input signal is derived from a magneto-resistive head;

applying a magneto-resistive adjustment to the series of digital samples to yield a corrected output, wherein the corrected output exhibits reduced signal asymmetry compared with the series of digital samples, wherein applying a magneto-resistive adjustment includes:

filtering the digital samples to yield an inverse filtered output, wherein filtering the digital samples includes inverse filtering the digital samples to yield an inverse filtered output, wherein the inverse filtering approximately reverses the filtering applied by the first filter circuit; and applying a magneto-resistive correction algorithm to the inverse filtered output that includes applying the same second order filtering to both positive values and negative values of the inverse filtered output to reduce signal asymmetry in the inverse filtered output, wherein the magneto-resistive correction algorithm yields a compensated output, and wherein the corrected output is derived from the compensated output; and equalizing the corrected output to yield an equalized output.

4. The method of claim 2, wherein the first filter circuit has six poles and two zeros.

5. The method of claim 3, wherein applying the magneto-resistive adjustment further comprises:

filtering the compensated output using a second filter circuit to yield the corrected output.

6. The method of claim 3, wherein the magneto-resistive correction algorithm is implemented using a single sided, second order filter.

7. The method of claim 3, wherein the magneto-resistive correction algorithm is implemented using a double sided, second order filter.

8. The system of claim 1, wherein the system is implemented as part of a storage device, and wherein the storage device further comprises:

a storage medium;

a magneto-resistive head assembly disposed in relation to the storage medium and operable to provide a sensed signal corresponding to information on the storage medium, wherein the sensed signal exhibits a non-linearity; and wherein the input signal is derived from the sensed signal.

9. A data processing system, the data processing system comprising:

a filter circuit operable to filter an analog input to yield an input signal;

an analog to digital converter circuit operable to convert the input signal into corresponding digital samples;

an equalizer circuit operable to equalize the corrected output to yield an equalized output;

a magneto-resistive adjustment circuit operable to reduce signal asymmetry in the digital samples due to sensing by a magneto-resistive head to yield a corrected output, wherein the magneto-resistive adjustment circuit includes:

an inverse filter circuit operable to approximately reverse the filtering applied by the filter circuit to yield an inverse filtered output;

and a digital magneto-resistive compensation circuit operable to apply the same second order filtering to both positive values and negative values of the inverse filtered output to reduce signal asymmetry in the inverse filtered output to yield a compensated output, wherein the corrected output is derived from the compensated output.

10. The data processing system of claim 9, wherein the filter circuit has six poles and two zeros.

11. The data processing system of claim 9, wherein the digital magneto-resistive compensation circuit is a single sided, second order filter.

12. The data processing system of claim 9, wherein the digital magneto-resistive compensation circuit is a double sided, second order filter.

13. The data processing system of claim 9, wherein the filter circuit is a first filter circuit, and wherein the magneto-resistive adjustment circuit further comprises:

a second filter circuit operable to filter the compensated output to yield the corrected output.

14. The data processing system of claim 13, wherein the inverse filter circuit is a digital finite impulse response filter circuit based upon least-squares criterion such that a convolution of the second filter circuit and the inverse filter circuit reduces inter-symbol interference.

15. The data processing system of claim 9, wherein the system is implemented as part of a storage device, and wherein the storage device further comprises:

a storage medium;

a magneto-resistive head assembly disposed in relation to the storage medium and operable to provide a sensed signal corresponding to information on the storage medium, wherein the sensed signal exhibits a non-linearity; and wherein the analog input is derived from the sensed signal.

* * * * *